(12) United States Patent
Kwan et al.

(10) Patent No.: US 8,729,806 B2
(45) Date of Patent: May 20, 2014

(54) RF-DRIVEN ION SOURCE WITH A BACK-STREAMING ELECTRON DUMP

(75) Inventors: Joe Kwan, Castro Valley, CA (US); Qing Ji, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 644 days.

(21) Appl. No.: 13/014,956

(22) Filed: Jan. 27, 2011

(65) Prior Publication Data
US 2011/0226422 A1 Sep. 22, 2011

Related U.S. Application Data

(60) Provisional application No. 61/300,725, filed on Feb. 2, 2010.

(51) Int. Cl.
*H05B 31/26* (2006.01)

(52) U.S. Cl.
USPC ............. 315/111.21; 315/111.31; 315/111.81

(58) Field of Classification Search
USPC ........................................ 315/111.01–111.91
See application file for complete search history.

(56) References Cited

U.S. PATENT DOCUMENTS

| | | | | |
|---|---|---|---|---|
| 5,198,718 | A | * | 3/1993 | Davis et al. ................. 313/359.1 |
| 6,035,868 | A | * | 3/2000 | Kennedy et al. ............... 134/1.1 |
| 6,514,376 | B1 | * | 2/2003 | Collins et al. ............ 156/345.37 |
| 7,176,469 | B2 | * | 2/2007 | Leung et al. ................ 250/423 R |
| 2010/0066252 | A1 | * | 3/2010 | Reijonen et al. ......... 315/111.81 |

OTHER PUBLICATIONS

Q. Ji, A. Sy, and J. W. Kwan, Rev. Sci. Instrum. 81, 02B312 (2010).
Q. Ji, X. Jiang, T. -J. King, K. -N. Leung, K. Standiford, and S. B. Wilde, J. Vac. Sci. Technol. B 20, 2717 (2002).
X. Jiang, Q. Ji, A. Chang, and K. -N. Leung, Rev. Sci. Instrum. 74, 2288 (2003).
S. K. Hahto, S. T. Hahto, Q. Ji, K. -N. Leung, E. L. Foley, L. R. Grisham, and F. M. Levinton, Rev. Sci. Instrum. 75, 355 (2004).
J. H. Vainionpaa, T. Kalvas, S. K. Hahto, and J. Reijonen, Rev. Sci. Instrum. 78, 063503 (2007).

* cited by examiner

*Primary Examiner* — Douglas W Owens
*Assistant Examiner* — Henry Luong
(74) *Attorney, Agent, or Firm* — Lawrence Berkeley National Laboratory

(57) ABSTRACT

A novel ion source is described having an improved lifetime. The ion source, in one embodiment, is a proton source, including an external RF antenna mounted to an RF window. To prevent backstreaming electrons formed in the beam column from striking the RF window, a back streaming electron dump is provided, which in one embodiment is formed of a cylindrical tube, open at one end to the ion source chamber and capped at its other end by a metal plug. The plug, maintained at the same electrical potential as the source, captures these backstreaming electrons, and thus prevents localized heating of the window, which due to said heating, might otherwise cause window damage.

14 Claims, 3 Drawing Sheets

RF-DRIVEN ION SOURCE WITH A BACK-STREAMING ELECTRON DUMP

CROSS-REFERENCE TO RELATED APPLICATIONS

This application claims priority to and the benefit of U.S. Provisional Patent Application No. 61/300,725 filed Feb. 2, 2010, the entire contents of which are incorporated herein by reference as if fully set out in its entirety.

STATEMENT OF GOVERNMENTAL SUPPORT

The invention described and claimed herein was made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

BACKGROUND OF THE INVENTION

1. Field of the Invention

This invention relates generally to ion sources, and, more specifically, to an improved ion source including a back-streaming electron dump.

2. Description of the Related Art

Radio Frequency (RF) driven ion sources have achieved a prominent role in semiconductor manufacturing, for both material deposition and etch, as well as for ion implantation. These ion sources have additionally been used as neutron generators for a variety of applications ranging from material identification for homeland security operations, to sources for linear accelerators widely used in medical applications.

These ion sources have generally been provided as chambers, to which the gas to be ionized is introduced, and then RF energy applied to the gas to form a plasma. Typically the RF energy is coupled to the gas using an RF antenna. Different antenna configurations have been used to drive the ion source, such as an internal antenna, an external helical antenna, and an external planar antenna. Lifetime has always been an issue for internal antennas. This has been largely overcome by the use of external antennas, particularly external planar antennas. However, for these external antennas, coupled to the plasma through a dielectric window, such as a quartz window, the inner surface of the quartz window is subject exposure to back-streaming electron bombardment, which results in localized, non uniform heating of the window, in turn inducing localized stresses, which over time can lead to cracking or breaking of the window.

BRIEF SUMMARY OF THE INVENTION

By way of this invention, a novel RF driven ion source is provided in which a back streaming electron dump is incorporated into the dielectric window/back plate of an ion source. In one embodiment the electron dump is provided in the form of a dielectric tube, in an embodiment the tube being formed of the same material as the window, the open ends of the tube brazed to a metal plug at one end, and fused to the center of the ion source chamber window at the other. In an embodiment the tube is positioned at the center of the window through which an opening has been provided to allow back streaming electrons to bypass the window through the opening, entering into the tube to thereafter be captured by the metal plug of the electron dump. In one embodiment the tube is positioned coaxially with the ion source chamber, and the ion source opening.

BRIEF DESCRIPTION OF THE DRAWINGS

The foregoing aspects and others will be readily appreciated by the skilled artisan from the following description of illustrative embodiments when read in conjunction with the accompanying drawings.

The size of an element in FIG. 1 is not meant to convey any meaning concerning the exact dimension of that element.

DETAILED DESCRIPTION

Figure 1:
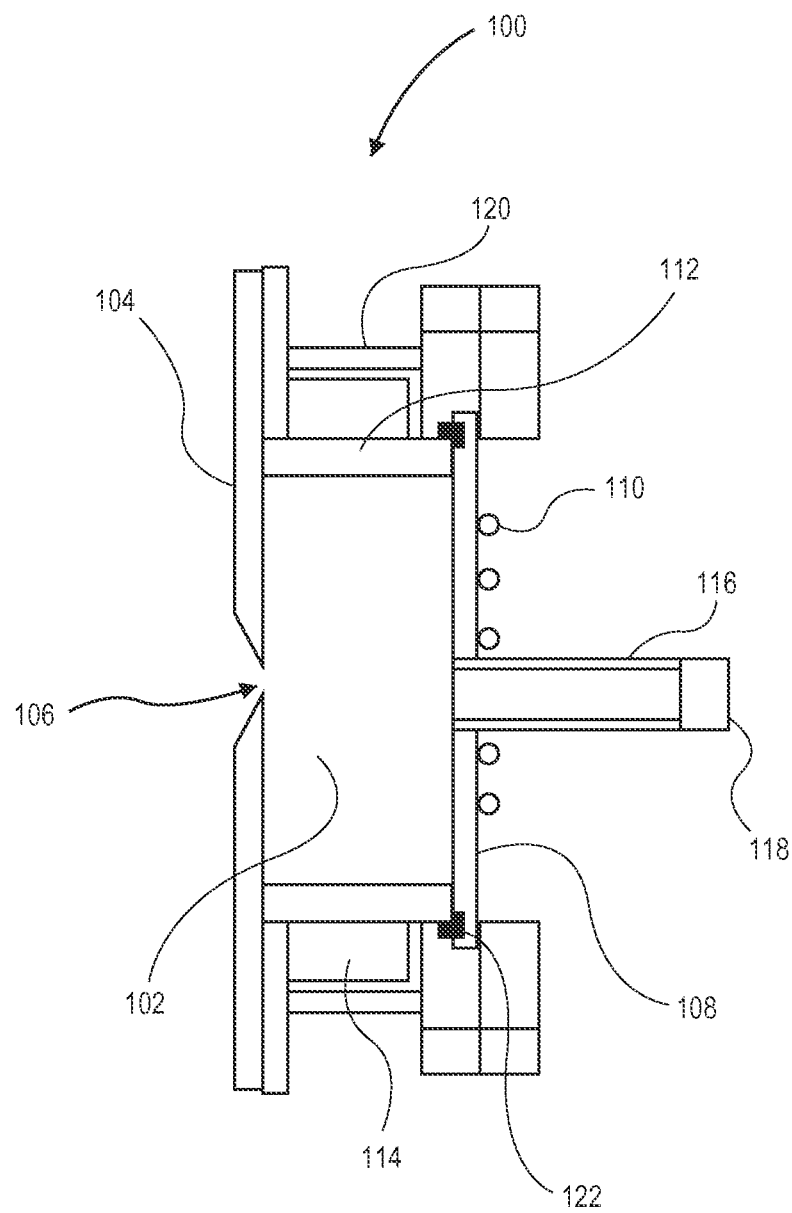
FIG. 1 is a cross sectional schematic showing an ion source chamber with the electron dump of the invention.

The ion source of this invention is depicted in FIG. 1. The ion source, in the embodiment illustrated employs a flat, coiled RF antenna, as more fully described in related pending U.S. application Ser. No. 12/425,951, filed Apr. 17, 2009, and assigned to the Regents of the University of California.

With reference to FIG. 1, an ion source chamber 100 is illustrated, chamber 100 defining a cylindrical cavity 102 in which a gas to be ionized, such as hydrogen, or in other embodiments oxygen, nitrogen, a noble gas such as argon, krypton, Xenon, etc., can be introduced into the source chamber though a gas feed (not shown). In one operational embodiment where the source is to be used as a proton source, the gas may be pure hydrogen, deuterium or tritium.

The chamber is defined by cylindrical chamber wall 112, extraction plate 104 and dielectric RF window 108. The cylindrical wall 112 typically is formed of a metal, such as aluminum, or other metal such as stainless steel, etc. It can also be formed from quartz, or a ceramic such as alumina ($Al_2O_3$), or other dielectric material. Extraction plate 104, which defines an extraction opening 106, is formed of aluminum, stainless steel, copper, etc, and it is maintained at the same electric potential as the source chamber (such as at ground potential). The rear wall of the chamber is defined by circular dielectric window or backplate 108. The dielectric window can be made from a number of materials such as quartz, alumina, aluminum nitride and the like. External planar helical antenna 110 provides RF power to the chamber, the antenna typically made from hollow copper tubing, which is connected to an RF power source. In one embodiment the tubing may be water filled so as to provide internal cooling to the antenna. The chamber may also be provided with an air cooling system (not shown) to provide further cooling of the RF antenna.

The sizing and/or number of turns of the copper tubing used for the RF antenna are not critical to the invention. By way of example, in one embodiment ⅛" diameter and 3/16" diameter copper tubes have been employed. The number of turns can vary, depending upon the size of the ion source chamber. Again by way of example, in an embodiment, four and a half turns of 3/16" diameter copper antenna provided the best RF signal coupling to plasma, in other applications two and a half to four and a half turns can be used.

The antenna 110 can be bonded to the RF window with a thermally conductive epoxy, which provides for better cooling of the RF window. Water cooled magnets 114, which in one embodiment may be permanent magnets, are placed around cylindrical chamber wall 112, and are themselves encased within an outer ion source chamber wall 120. Magnets 114 are positioned around the plasma cavity 102 to create a "multicusp" magnetic configuration for improved plasma confinement. Dielectric window 108 can either be sealed by O-ring 122 or brazed to metal at its edge, which can then be directly welded to the ion source chamber. The chamber is also connected to a vacuum system (not shown) for operation at low pressures.

The electron beam dump of the invention comprises a tube or cylinder 116, affixed at its one end to dielectric window 108, and terminated at its other end by brazed metal plug 118. Tube 116 can be formed of quartz, or other dielectric material such as alumina, aluminum nitride, and the like. Preferably, the thermal coefficient of expansion of the material used for tube 116 should be the same as or similar to that of the material used for window 108. In one embodiment where window 108 is quartz, the tube material is also quartz.

The metal used for beam dump/plug 118 in one embodiment can be copper. However, the metal plug may be formed of any conductive metal that can be bonded or brazed to tube 116, such as aluminum, stainless steel, molybdenum, etc. The selected metal should also be a good heat conductor as well. In one embodiment, provision is provided for water cooling of the plug, such as by including a channel (not shown) for running cooling water through the plug. Tube 116 at its other, open end is fused in one embodiment to RF window 108 at an opening in the window. In one embodiment, the electron beam dump is fused to the RF window at its center, as illustrated in the figure.

It is to be appreciated that neither the cross sectional size of the beam dump, nor its cross sectional shape is critical. Thus the tube in cross section could be square, or oval, as well as round. What is important, is that it present a beam dump surface at least as large as the footprint of backstreaming electron beam falling upon the backplate/window (the size of the beam proportional to the size of the extraction opening 106, be it a slit or one or more rounded openings).

EXAMPLES

Figure 2:
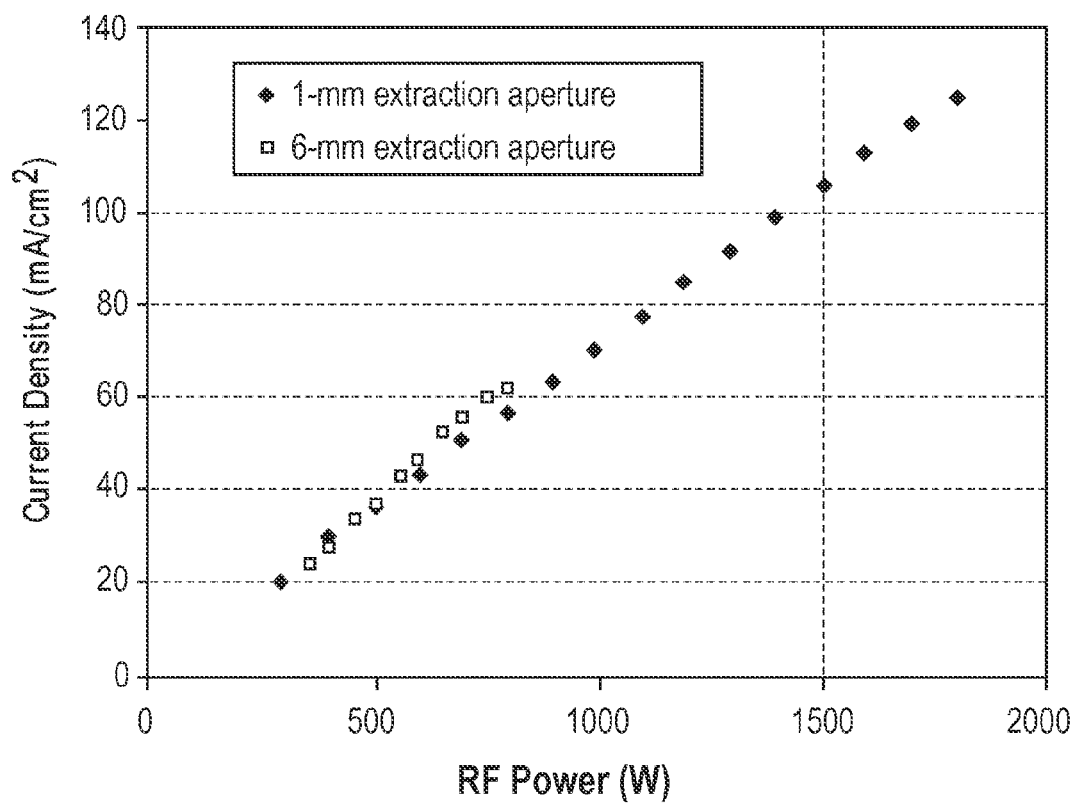
FIG. 2 is a plot of extracted current density as a function of applied RF power.

In a first experiment, an ion source was used with hydrogen gas as the proton source. The source, equipped with the backstreaming electron beam dump of the invention, was operated at 10 mTorr, with the RF power source operating at 13.6 MHz. Current density of the extracted beam was measured against input power to the RF coil, the results plotted in FIG. 2. The ion source used in the experiment had an overall internal diameter of 10 cm, chamber height of 6 cm, and an air cooled quartz window, in a first series of runs, a 1 mm extraction aperture was used. In a second series of runs, a 6 mm extraction aperture was used. As shown in the figure, at 1800 watts, the extracted current density reached approximately 125 mA/cm$^2$.

Figure 3:
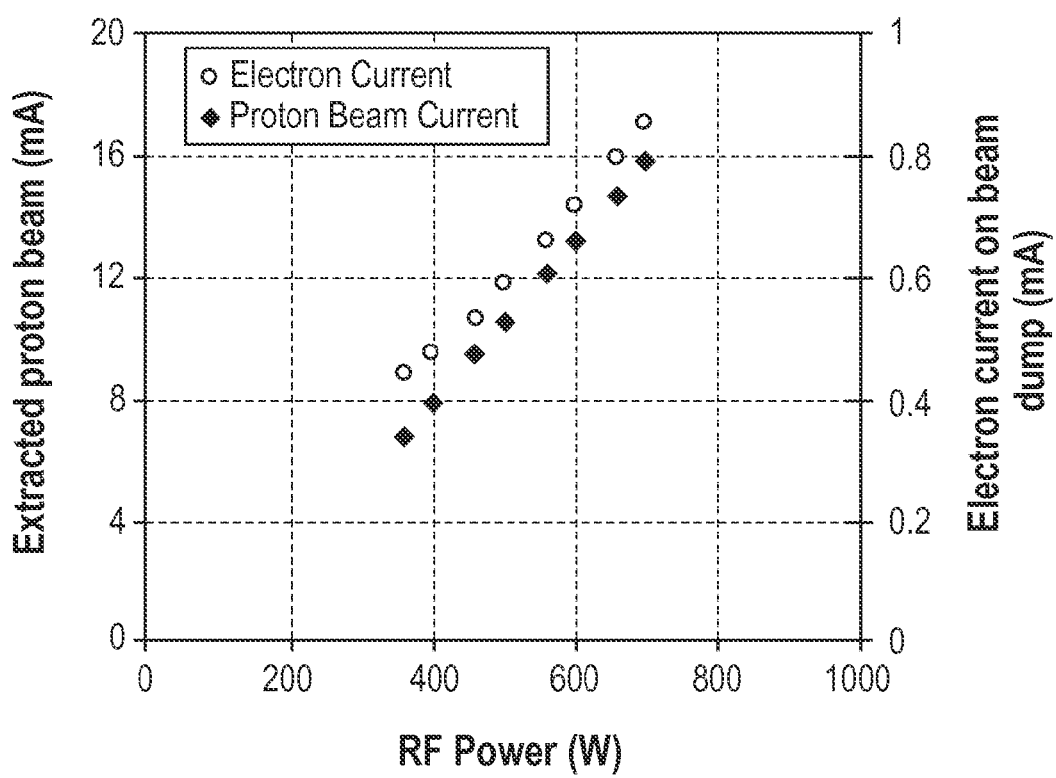
FIG. 3 is a plot of extracted proton beam through an aperture and back-streaming electron current monitored on the beam dump as a function of applied RF power.

With the back-streaming electron dump positioned to the center of the quartz RF window to collect back-streaming electrons when extracting positive ions, a resistor was connected between the electron dump and the plasma electrode (face plate 104) to monitor the back-streaming electron current. As shown in FIG. 3, both the extracted proton beam and electron current measured on the beam dump increase as RF power increases, the back-streaming electron beam following the same trend as the extracted proton beam. Less than 1 mA of back-streaming electrons was measured when 16 mA of protons were extracted through a 6 mm extraction aperture at an RF power of 700 W. It was also noted that minimal plasma diffused to the quartz tube of the electron dump.

Electrons generated in the beam line by interaction of extracted ions with residual gases in the beam line, and impacts of the beam with physical components of the beam column, such electrons generating an electron backstream, have long presented problems. These high energy electrons, accelerated in the opposite direction by the same lenses that accelerate the extracted ions, enter the ion source through the source opening to fall upon the source back plate, in an area in line with the opening. This electron column striking the back plate causes localized, non-uniform heating which generates internal stresses within the back plate material. Over time this non-uniform heating can result in damage to the back plate, such as cracking or ultimately breaking. By employing the electron dump of this invention, the back streaming electron column thus is prevented from striking the chamber backplate, thus preventing localized heating, with a resultant improvement in chamber lifetime. As has been demonstrated, the operation of the electron beam dump does not interfere with plasma formation nor impact the ion beam extracted from the source.

As earlier noted, the surface area of the beam dump should be in-line with the extraction opening 106 of extraction plate 104 for maximum capture of the backstreaming electron beam. Further, the cross sectional area of tube 116 should be large enough so as receive substantially all of the backstreaming e beam entering the tithe. In one embodiment, the cross section of tube 116 mimics the shape of the extraction aperture, with the area of the opening defined by the one end of tube 116 being at least as large as the footprint of the electron beam at the point it reaches window 108. Thus, by example, given an extraction slit which is either rectangular or oval, the tube can be of rectangular or oval cross section, or of a large enough circular cross section so as still be able to receive all of the beam footprint. For a circular aperture, the tube is typically of the similar circular cross section.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. A Radio Frequency (RF) driven ion source including:
    an ion source chamber defining a cavity, the ion source chamber including an RF window at a first end of the ion source chamber and an extraction plate at a second end of the ion source chamber, the extraction plate defining an extraction opening, and the RF window defining an open region;
    an RF antenna disposed external to the cavity of the ion source chamber and proximate the RF window; and
    an electron beam dump attached to the RF window proximate the open region in the RF window, the electron beam dump comprising a tube, a first end of the tube attached to the RF window, and a second end of the tube comprising a metal plug.

2. The RF driven ion source of claim 1 wherein the metal plug comprises copper, aluminum, stainless steel, or molybdenum.

3. The RF driven ion source of claim 1 wherein the electron beam dump is positioned opposite the extraction opening in the extraction plate.

4. The RF driven ion source of claim 1 wherein a surface area of the metal plug of the electron beam dump is at least as large as a footprint of a backstreaming electron beam generated when the RF driven ion source is in operation.

5. The RF driven source of claim 1 wherein the open region in the RF window is positioned at a center of the RF window.

6. The RF driven ion source of claim 1 wherein the electron beam dump is fused to the RF window.

7. The RF driven ion source of claim 1 wherein the ion source chamber further defines a gas feed configured to admit one or more gases to the cavity of the ion source chamber.

8. The RF driven ion source of claim 1 wherein the RF antenna is a flat coiled antenna.

9. The RF driven ion source of claim 8 wherein the flat coiled antenna is attached to the RF window with a thermally conductive epoxy.

10. The RF driven ion source of claim 1 wherein the RF window comprises a dielectric material.

11. The RF driven ion source of claim 10 wherein the dielectric material is selected from the group consisting of quartz, aluminum oxide, and aluminum nitride.

12. The RF driven ion source of claim 1 wherein the metal plug is maintained at a same electrical potential as the ion source chamber when the RF driven ion source is in operation.

13. The RF driven ion source of claim 1 further including:
    magnets external to the cavity of the ion source chamber positioned to create a multicusp magnet configuration.

14. The RF driven ion source of claim 1 wherein the first end of the ion source chamber is opposite the second end of the ion source chamber.

* * * * *